(12) United States Patent
Riker et al.

(10) Patent No.: US 8,980,045 B2
(45) Date of Patent: Mar. 17, 2015

(54) SUBSTRATE CLEANING CHAMBER AND COMPONENTS

(75) Inventors: Martin Riker, Milpitas, CA (US); Wei W. Wang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 425 days.

(21) Appl. No.: 13/109,917

(22) Filed: May 17, 2011

(65) Prior Publication Data

US 2011/0232845 A1    Sep. 29, 2011

Related U.S. Application Data

(62) Division of application No. 11/857,975, filed on Sep. 19, 2007, now Pat. No. 7,942,969.

(60) Provisional application No. 60/940,959, filed on May 30, 2007.

(51) Int. Cl.
| B08B 13/00 | (2006.01) |
| C23F 1/08 | (2006.01) |
| F16L 25/00 | (2006.01) |
| B23P 11/00 | (2006.01) |
| H01J 37/32 | (2006.01) |

(52) U.S. Cl.
CPC ....... H01J 37/32357 (2013.01); H01J 37/3244 (2013.01); H01J 37/32477 (2013.01); H01J 37/32871 (2013.01); H01J 2237/0213 (2013.01); H01J 2237/0268 (2013.01); H01J 2237/2001 (2013.01); H01J 2237/335 (2013.01)
USPC ............ 156/345.33; 156/345.34; 156/345.35; 118/715; 118/723 ME; 118/723 ER; 29/428; 285/334.5

(58) Field of Classification Search
USPC ........ 156/345.33, 345.34, 345.35; 285/334.5; 29/428; 118/715, 723 ME, 723 ER
See application file for complete search history.

(56) References Cited

U.S. PATENT DOCUMENTS

| 2,705,500 A | 4/1955 | Deer |
| 3,117,883 A | 1/1964 | Pierett |
| 3,457,151 A | 7/1969 | Kortejarvi |

(Continued)

FOREIGN PATENT DOCUMENTS

| DE | 19719133 | 11/1998 |
| EP | 0239349 | 9/1987 |

(Continued)

OTHER PUBLICATIONS

Nakasuji, et al., "Low Voltage and High Speed Operating Electrostatic Wafer Chuck," J. Vac. Sci. Technol. A, 10(6):3573-3578 (Nov./Dec. 1992).

(Continued)

*Primary Examiner* — Sylvia R MacArthur
(74) *Attorney, Agent, or Firm* — Ashok. K. Janah; Janah & Associates, PC (57) ABSTRACT

A consumable ceramic liner can be used for connecting a gas outlet channel of a remote chamber to a gas inlet channel of a substrate cleaning chamber. The ceramic liner comprises an inlet cylinder having an outer diameter sized to fit in the gas outlet channel of the remote chamber, and an outlet cylinder connected to the gas inlet channel of the substrate cleaning chamber. A conical flare joins the inlet cylinder to the outlet cylinder.

23 Claims, 5 Drawing Sheets

(56) References Cited

U.S. PATENT DOCUMENTS

| | | |
|---|---|---|
| 3,482,082 A | 12/1969 | Israeli |
| 3,522,083 A | 7/1970 | Woolman |
| 3,565,771 A | 2/1971 | Gulla |
| 3,679,460 A | 7/1972 | Reid |
| RE31,198 E | 4/1983 | Binns |
| 4,412,133 A | 10/1983 | Eckes et al. |
| 4,419,201 A | 12/1983 | Levinstein et al. |
| 4,480,284 A | 10/1984 | Tojo et al. |
| 4,491,496 A | 1/1985 | Laporte et al. |
| 4,606,802 A | 8/1986 | Kobayashi et al. |
| 4,645,218 A | 2/1987 | Ooshio et al. |
| 4,665,463 A | 5/1987 | Ward et al. |
| 4,673,554 A | 6/1987 | Niwa et al. |
| 4,713,119 A | 12/1987 | Earhart et al. |
| 4,717,462 A | 1/1988 | Homma et al. |
| 4,732,792 A | 3/1988 | Fujiyama |
| 4,756,322 A | 7/1988 | Lami |
| 4,832,781 A | 5/1989 | Mears |
| 4,854,263 A * | 8/1989 | Chang et al. ............ 118/715 |
| 4,872,250 A | 10/1989 | De Marco |
| 4,913,784 A | 4/1990 | Bogenschutz et al. |
| 4,959,105 A | 9/1990 | Neidiffer et al. |
| 4,995,958 A | 2/1991 | Anderson et al. |
| 4,996,859 A | 3/1991 | Rose et al. |
| 5,009,966 A | 4/1991 | Garg et al. |
| 5,032,469 A | 7/1991 | Merz et al. |
| 5,052,331 A | 10/1991 | Buhrmaster et al. |
| 5,055,964 A | 10/1991 | Logan et al. |
| 5,064,511 A | 11/1991 | Gobbetti et al. |
| 5,104,501 A | 4/1992 | Okabayashi |
| 5,104,834 A | 4/1992 | Watanabe et al. |
| 5,117,121 A | 5/1992 | Watanabe et al. |
| 5,151,845 A | 9/1992 | Watanabe et al. |
| 5,164,016 A | 11/1992 | Henriet et al. |
| 5,166,856 A | 11/1992 | Liporace et al. |
| 5,180,322 A | 1/1993 | Yamamoto et al. |
| 5,180,563 A | 1/1993 | Lai et al. |
| 5,191,506 A | 3/1993 | Logan et al. |
| 5,202,008 A | 4/1993 | Talieh |
| 5,215,624 A | 6/1993 | Dastolfo et al. |
| 5,215,639 A | 6/1993 | Boys |
| 5,248,386 A | 9/1993 | Dastolfo et al. |
| 5,258,047 A | 11/1993 | Tokisue et al. |
| 5,270,266 A | 12/1993 | Hirano et al. |
| 5,275,683 A | 1/1994 | Arami et al. |
| 5,280,156 A | 1/1994 | Niori et al. |
| 5,292,554 A | 3/1994 | Sinha et al. |
| 5,304,248 A | 4/1994 | Cheng et al. |
| 5,314,597 A | 5/1994 | Harra |
| 5,315,473 A | 5/1994 | Collins et al. |
| 5,324,053 A | 6/1994 | Kubota et al. |
| 5,325,261 A | 6/1994 | Horwitz |
| 5,338,367 A | 8/1994 | Henriet et al. |
| 5,350,479 A | 9/1994 | Collins et al. |
| 5,356,723 A | 10/1994 | Kimoto et al. |
| 5,366,585 A | 11/1994 | Robertson et al. |
| 5,382,469 A | 1/1995 | Kubota et al. |
| 5,391,275 A | 2/1995 | Mintz |
| 5,401,319 A | 3/1995 | Banholzer et al. |
| 5,407,551 A | 4/1995 | Sieck et al. |
| 5,409,590 A | 4/1995 | Hurwitt et al. |
| 5,429,711 A | 7/1995 | Watanabe et al. |
| 5,433,835 A | 7/1995 | Demaray et al. |
| 5,458,759 A | 10/1995 | Hosokawa et al. |
| 5,460,694 A | 10/1995 | Schapira et al. |
| 5,463,526 A | 10/1995 | Mundt |
| 5,474,649 A | 12/1995 | Kava et al. |
| 5,487,822 A | 1/1996 | Demaray et al. |
| 5,490,913 A | 2/1996 | Schertler et al. |
| 5,509,558 A | 4/1996 | Imai et al. |
| 5,512,078 A | 4/1996 | Griffin |
| 5,518,593 A | 5/1996 | Hosokawa et al. |
| 5,520,740 A | 5/1996 | Kanai et al. |
| 5,531,835 A | 7/1996 | Fodor et al. |
| 5,542,559 A | 8/1996 | Kawakami et al. |
| 5,549,802 A | 8/1996 | Guo |
| 5,587,039 A | 12/1996 | Salimian et al. |
| 5,605,637 A | 2/1997 | Shan et al. |
| 5,614,055 A | 3/1997 | Fairbairn et al. |
| 5,614,071 A | 3/1997 | Mahvan et al. |
| 5,643,422 A | 7/1997 | Yamada |
| 5,658,442 A | 8/1997 | Van Gogh et al. |
| 5,660,640 A | 8/1997 | Laube |
| 5,671,835 A | 9/1997 | Tanaka et al. |
| 5,684,669 A | 11/1997 | Collins et al. |
| 5,685,914 A | 11/1997 | Hills et al. |
| 5,685,959 A | 11/1997 | Bourez et al. |
| 5,690,795 A | 11/1997 | Rosenstein et al. |
| 5,695,825 A | 12/1997 | Scruggs |
| 5,700,179 A | 12/1997 | Hasegawa et al. |
| 5,714,010 A | 2/1998 | Matsuyama et al. |
| 5,720,818 A | 2/1998 | Donde et al. |
| 5,736,021 A | 4/1998 | Ding et al. |
| 5,745,331 A | 4/1998 | Shamouilian et al. |
| 5,748,434 A | 5/1998 | Rossman et al. |
| 5,755,887 A | 5/1998 | Sano et al. |
| 5,762,748 A | 6/1998 | Banholzer et al. |
| 5,763,851 A | 6/1998 | Forster et al. |
| 5,792,562 A | 8/1998 | Collins et al. |
| 5,800,686 A | 9/1998 | Littau et al. |
| 5,803,977 A | 9/1998 | Tepman et al. |
| 5,808,270 A | 9/1998 | Marantz et al. |
| 5,810,931 A | 9/1998 | Stevens et al. |
| 5,812,362 A | 9/1998 | Ravi |
| 5,821,166 A | 10/1998 | Hajime et al. |
| 5,824,197 A | 10/1998 | Tanaka |
| 5,830,327 A | 11/1998 | Kolnekow |
| 5,840,434 A | 11/1998 | Kojima et al. |
| 5,846,330 A * | 12/1998 | Quirk et al. ............ 118/723 DC |
| 5,855,687 A | 1/1999 | DuBois et al. |
| 5,858,100 A | 1/1999 | Maeda et al. |
| 5,868,847 A | 2/1999 | Chen et al. |
| 5,876,573 A | 3/1999 | Moslehi et al. |
| 5,879,523 A | 3/1999 | Wang et al. |
| 5,879,524 A | 3/1999 | Hurwitt et al. |
| 5,885,428 A | 3/1999 | Kogan |
| 5,886,863 A | 3/1999 | Nagasaki et al. |
| 5,893,643 A | 4/1999 | Kumar et al. |
| 5,901,751 A | 5/1999 | Huo |
| 5,903,428 A | 5/1999 | Grimard et al. |
| 5,910,338 A | 6/1999 | Donde et al. |
| 5,916,378 A | 6/1999 | Bailey et al. |
| 5,916,454 A | 6/1999 | Richardson et al. |
| 5,920,764 A | 7/1999 | Hanson |
| 5,922,133 A | 7/1999 | Tepman et al. |
| 5,930,661 A | 7/1999 | Lu |
| 5,939,146 A | 8/1999 | Lavernia |
| 5,942,041 A | 8/1999 | Lo et al. |
| 5,942,445 A | 8/1999 | Kato et al. |
| 5,948,288 A | 9/1999 | Treves et al. |
| 5,951,374 A | 9/1999 | Kato et al. |
| 5,951,775 A | 9/1999 | Tepman |
| 5,953,827 A | 9/1999 | Or et al. |
| 5,963,778 A | 10/1999 | Stellrecht |
| 5,967,047 A | 10/1999 | Kuhn et al. |
| 5,976,327 A | 11/1999 | Tanaka |
| 5,985,033 A | 11/1999 | Yudovsky et al. |
| 6,000,415 A | 12/1999 | Huo et al. |
| 6,010,583 A | 1/2000 | Annavarapu et al. |
| 6,014,979 A | 1/2000 | Van Autryve et al. |
| 6,015,465 A | 1/2000 | Kholodenko et al. |
| 6,026,666 A | 2/2000 | Zimmermann et al. |
| 6,027,604 A | 2/2000 | Lim et al. |
| 6,036,587 A | 3/2000 | Tolles et al. |
| 6,051,114 A | 4/2000 | Yao et al. |
| 6,051,122 A | 4/2000 | Flanigan |
| 6,059,945 A | 5/2000 | Fu et al. |
| 6,068,685 A | 5/2000 | Lorimer et al. |
| 6,071,389 A | 6/2000 | Zhang |
| 6,073,830 A | 6/2000 | Hunt et al. |
| 6,086,735 A | 7/2000 | Gilman et al. |
| 6,090,210 A | 7/2000 | Ballance et al. |
| 6,095,084 A | 8/2000 | Shamouilian et al. |
| 6,096,135 A | 8/2000 | Guo et al. |

(56) References Cited

U.S. PATENT DOCUMENTS

| | | |
|---|---|---|
| 6,103,069 A | 8/2000 | Davenport |
| 6,103,070 A | 8/2000 | Hong |
| 6,106,625 A | 8/2000 | Koai et al. |
| 6,108,189 A | 8/2000 | Weldon et al. |
| 6,120,621 A | 9/2000 | Jin et al. |
| 6,120,640 A | 9/2000 | Shih et al. |
| 6,123,804 A | 9/2000 | Babassi et al. |
| 6,132,566 A | 10/2000 | Hofmann et al. |
| 6,143,086 A | 11/2000 | Tepman |
| 6,143,432 A | 11/2000 | de Rochemont et al. |
| 6,146,509 A | 11/2000 | Aragon |
| 6,149,784 A | 11/2000 | Su et al. |
| 6,150,762 A | 11/2000 | Kim et al. |
| 6,152,071 A | 11/2000 | Akiyama et al. |
| 6,156,124 A | 12/2000 | Tobin |
| 6,159,299 A | 12/2000 | Koai et al. |
| 6,162,297 A | 12/2000 | Mintz et al. |
| 6,162,336 A | 12/2000 | Lee |
| 6,168,668 B1 | 1/2001 | Yudovsky |
| 6,170,429 B1 | 1/2001 | Schoepp et al. |
| 6,176,981 B1 | 1/2001 | Hong et al. |
| 6,183,614 B1 | 2/2001 | Fu |
| 6,183,686 B1 | 2/2001 | Bardus et al. |
| 6,190,513 B1 | 2/2001 | Forster et al. |
| 6,190,516 B1 | 2/2001 | Xiong et al. |
| 6,196,532 B1 | 3/2001 | Otwell |
| 6,198,067 B1 | 3/2001 | Ikeda et al. |
| 6,199,259 B1 | 3/2001 | Demaray et al. |
| 6,210,539 B1 | 4/2001 | Tanaka et al. |
| 6,221,217 B1 | 4/2001 | Moslehi et al. |
| 6,227,435 B1 | 5/2001 | Lazarz et al. |
| 6,235,163 B1 | 5/2001 | Angalo et al. |
| 6,238,528 B1 | 5/2001 | Xu et al. |
| 6,248,667 B1 | 6/2001 | Kim et al. |
| 6,250,251 B1 | 6/2001 | Akiyama et al. |
| 6,254,737 B1 | 7/2001 | Edelstein et al. |
| 6,258,170 B1 | 7/2001 | Somekh et al. |
| 6,264,812 B1 | 7/2001 | Raaijmakers et al. |
| 6,269,670 B2 | 8/2001 | Koestermeier |
| 6,270,859 B2 | 8/2001 | Zhao et al. |
| 6,274,008 B1 | 8/2001 | Gopalraja et al. |
| 6,276,997 B1 | 8/2001 | Li |
| 6,280,584 B1 | 8/2001 | Kumar et al. |
| 6,284,093 B1 | 9/2001 | Ke et al. |
| 6,287,437 B1 | 9/2001 | Pandhumsoporn et al. |
| 6,299,740 B1 | 10/2001 | Hieronymi et al. |
| 6,306,489 B1 | 10/2001 | Hellmann et al. |
| 6,306,498 B1 | 10/2001 | Yuuki et al. |
| 6,328,808 B1 | 12/2001 | Tsai et al. |
| 6,338,781 B1 | 1/2002 | Sichmann et al. |
| 6,338,906 B1 | 1/2002 | Ritland et al. |
| 6,340,415 B1 | 1/2002 | Raaijmakers et al. |
| 6,344,114 B1 | 2/2002 | Sichmann et al. |
| 6,358,376 B1 | 3/2002 | Wang et al. |
| 6,364,957 B1 | 4/2002 | Schneider et al. |
| 6,365,010 B1 | 4/2002 | Hollars |
| 6,368,469 B1 | 4/2002 | Nulman et al. |
| 6,372,609 B1 | 4/2002 | Aga |
| 6,374,512 B1 | 4/2002 | Guo et al. |
| 6,379,575 B1 | 4/2002 | Yin et al. |
| 6,383,459 B1 | 5/2002 | Singh et al. |
| 6,387,809 B2 | 5/2002 | Toyama |
| 6,391,146 B1 | 5/2002 | Bhatnagar et al. |
| 6,394,023 B1 | 5/2002 | Crocker |
| 6,398,929 B1 | 6/2002 | Chiang et al. |
| 6,401,652 B1 | 6/2002 | Mohn et al. |
| 6,416,634 B1 | 7/2002 | Mostovoy et al. |
| 6,423,175 B1 | 7/2002 | Huang et al. |
| 6,432,203 B1 | 8/2002 | Black et al. |
| 6,436,192 B2 | 8/2002 | Chen et al. |
| 6,440,221 B2 | 8/2002 | Shamouilian et al. |
| 6,444,083 B1 | 9/2002 | Steger et al. |
| 6,447,853 B1 | 9/2002 | Suzuki et al. |
| 6,454,870 B1 | 9/2002 | Brooks |
| 6,458,693 B1 | 10/2002 | Park et al. |
| 6,475,336 B1 | 11/2002 | Hubacek |
| 6,497,797 B1 | 12/2002 | Kim |
| 6,500,321 B1 | 12/2002 | Ashtiani et al. |
| 6,503,331 B1 | 1/2003 | Yudovsky et al. |
| 6,506,290 B1 | 1/2003 | Ono |
| 6,506,312 B1 | 1/2003 | Bottomfield |
| 6,545,267 B1 | 4/2003 | Miura et al. |
| 6,555,471 B2 | 4/2003 | Sandhu et al. |
| 6,558,505 B2 | 5/2003 | Suzuki et al. |
| 6,565,984 B1 | 5/2003 | Wu et al. |
| 6,566,161 B1 | 5/2003 | Rosenberg et al. |
| 6,572,732 B2 | 6/2003 | Collins |
| 6,576,909 B2 | 6/2003 | Donaldson et al. |
| 6,579,431 B1 | 6/2003 | Bolcavage et al. |
| 6,589,407 B1 | 7/2003 | Subramani et al. |
| 6,599,405 B2 | 7/2003 | Hunt et al. |
| 6,605,177 B2 | 8/2003 | Mett et al. |
| 6,617,553 B2 | 9/2003 | Ho et al. |
| 6,619,537 B1 | 9/2003 | Zhang et al. |
| 6,620,736 B2 | 9/2003 | Drewery |
| 6,623,595 B1 | 9/2003 | Han et al. |
| 6,623,596 B1 | 9/2003 | Collins et al. |
| 6,623,597 B1 | 9/2003 | Han et al. |
| 6,623,610 B1 | 9/2003 | Onishi |
| 6,627,050 B2 | 9/2003 | Miller et al. |
| 6,627,056 B2 | 9/2003 | Wang et al. |
| H2087 H | 11/2003 | Balliett et al. |
| 6,645,357 B2 | 11/2003 | Powell |
| 6,652,668 B1 | 11/2003 | Perry et al. |
| 6,652,716 B2 | 11/2003 | Kao et al. |
| 6,660,135 B2 | 12/2003 | Yu et al. |
| 6,667,577 B2 | 12/2003 | Shannon et al. |
| 6,673,199 B1 | 1/2004 | Yamartino et al. |
| 6,676,812 B2 | 1/2004 | Chung |
| 6,682,627 B2 | 1/2004 | Shamouilian et al. |
| 6,689,249 B2 | 2/2004 | Ke et al. |
| 6,689,252 B1 | 2/2004 | Shamouilian et al. |
| 6,708,870 B2 | 3/2004 | Koenigsmann et al. |
| 6,723,214 B2 | 4/2004 | Stimson et al. |
| 6,726,805 B2 | 4/2004 | Brown et al. |
| 6,730,174 B2 | 5/2004 | Liu et al. |
| 6,743,340 B2 | 6/2004 | Fu |
| 6,749,103 B1 | 6/2004 | Ivanov et al. |
| 6,776,879 B2 | 8/2004 | Yamamoto et al. |
| 6,777,045 B2 | 8/2004 | Lin et al. |
| 6,783,639 B2 | 8/2004 | Nulman et al. |
| 6,797,362 B2 | 9/2004 | Parfeniuk et al. |
| 6,797,639 B2 | 9/2004 | Carducci et al. |
| 6,811,657 B2 | 11/2004 | Jaso |
| 6,812,471 B2 | 11/2004 | Popiolkowski et al. |
| 6,824,612 B2 | 11/2004 | Stevens et al. |
| 6,824,652 B2 | 11/2004 | Park |
| 6,837,968 B2 | 1/2005 | Brown et al. |
| 6,840,427 B2 | 1/2005 | Ivanov |
| 6,846,396 B2 | 1/2005 | Perrin |
| 6,858,116 B2 | 2/2005 | Okabe et al. |
| 6,872,284 B2 | 3/2005 | Ivanov et al. |
| 6,902,627 B2 | 6/2005 | Brueckner et al. |
| 6,902,628 B2 | 6/2005 | Wang et al. |
| 6,916,407 B2 | 7/2005 | Voser et al. |
| 6,933,025 B2 | 8/2005 | Lin et al. |
| 6,933,508 B2 | 8/2005 | Popiolkowski et al. |
| 6,942,753 B2 | 9/2005 | Choi et al. |
| 6,955,748 B2 | 10/2005 | Kim |
| 6,955,852 B2 | 10/2005 | Ivanov |
| 6,983,892 B2 | 1/2006 | Noorbakhsh et al. |
| 6,992,261 B2 | 1/2006 | Kachalov et al. |
| 7,026,009 B2 | 4/2006 | Lin et al. |
| 7,041,200 B2 | 5/2006 | Le et al. |
| 7,049,612 B2 | 5/2006 | Quach et al. |
| 7,063,773 B2 | 6/2006 | Ivanov et al. |
| 7,097,744 B2 | 8/2006 | Liu et al. |
| 7,121,938 B2 | 10/2006 | Suzuki |
| 7,131,883 B2 | 11/2006 | Park et al. |
| 7,141,138 B2 | 11/2006 | Gondhalekar et al. |
| 7,146,703 B2 | 12/2006 | Ivanov |
| 7,223,323 B2 | 5/2007 | Yang et al. |
| 7,264,679 B2 | 9/2007 | Schweitzer et al. |
| 7,270,713 B2 | 9/2007 | Blonigan et al. |

(56) References Cited

U.S. PATENT DOCUMENTS

| | | |
|---|---|---|
| 7,294,224 B2 | 11/2007 | Vesci et al. |
| 7,294,245 B2 | 11/2007 | Fu |
| 7,407,565 B2 | 8/2008 | Wang et al. |
| 7,504,008 B2 | 3/2009 | Doan et al. |
| 7,579,067 B2 | 8/2009 | Lin et al. |
| 7,604,708 B2 | 10/2009 | Wood et al. |
| 7,618,769 B2 | 11/2009 | Brueckner et al. |
| 2001/0001367 A1 | 5/2001 | Koestermeier |
| 2001/0033706 A1 | 10/2001 | Shimomura et al. |
| 2001/0045353 A1 | 11/2001 | Hieronymi et al. |
| 2002/0029745 A1 | 3/2002 | Nagaiwa et al. |
| 2002/0033330 A1 | 3/2002 | Demaray et al. |
| 2002/0066531 A1 | 6/2002 | Ke et al. |
| 2002/0076490 A1 | 6/2002 | Chiang et al. |
| 2002/0086118 A1 | 7/2002 | Chang et al. |
| 2002/0090464 A1 | 7/2002 | Jiang et al. |
| 2002/0092618 A1 | 7/2002 | Collins |
| 2002/0100680 A1 | 8/2002 | Yamamoto et al. |
| 2003/0000647 A1 | 1/2003 | Yudovsky |
| 2003/0006008 A1 | 1/2003 | Horioka et al. |
| 2003/0019746 A1 | 1/2003 | Ford et al. |
| 2003/0026917 A1 | 2/2003 | Lin et al. |
| 2003/0029568 A1 | 2/2003 | Brown et al. |
| 2003/0037883 A1 | 2/2003 | Mett et al. |
| 2003/0047464 A1 | 3/2003 | Sun et al. |
| 2003/0077199 A1 | 4/2003 | Sandlin et al. |
| 2003/0085121 A1 | 5/2003 | Powell |
| 2003/0108680 A1 | 6/2003 | Gell et al. |
| 2003/0116276 A1 | 6/2003 | Weldon et al. |
| 2003/0118731 A1 | 6/2003 | He et al. |
| 2003/0127319 A1 | 7/2003 | Demaray et al. |
| 2003/0136428 A1 | 7/2003 | Krogh |
| 2003/0168168 A1 | 9/2003 | Liu et al. |
| 2003/0170486 A1 | 9/2003 | Austin et al. |
| 2003/0173526 A1 | 9/2003 | Popiolkowski et al. |
| 2003/0185965 A1 | 10/2003 | Lin et al. |
| 2003/0188685 A1 | 10/2003 | Wang et al. |
| 2003/0196890 A1 | 10/2003 | Le et al. |
| 2003/0217693 A1 | 11/2003 | Rattner et al. |
| 2003/0218054 A1 | 11/2003 | Koenigsmann et al. |
| 2003/0221702 A1 | 12/2003 | Peebles |
| 2004/0016637 A1 | 1/2004 | Yang et al. |
| 2004/0026233 A1 | 2/2004 | Perrin |
| 2004/0031677 A1 | 2/2004 | Wang et al. |
| 2004/0045574 A1 | 3/2004 | Tan |
| 2004/0056070 A1 | 3/2004 | Ivanov |
| 2004/0056211 A1 | 3/2004 | Popiolkowski et al. |
| 2004/0069223 A1* | 4/2004 | Tzeng et al. ................ 118/715 |
| 2004/0079634 A1 | 4/2004 | Wickersham et al. |
| 2004/0083977 A1 | 5/2004 | Brown et al. |
| 2004/0099285 A1 | 5/2004 | Wang et al. |
| 2004/0113364 A1 | 6/2004 | Ivanov |
| 2004/0118521 A1 | 6/2004 | Pancham et al. |
| 2004/0126952 A1 | 7/2004 | Gondhalekar et al. |
| 2004/0129211 A1 | 7/2004 | Blonigan et al. |
| 2004/0134427 A1 | 7/2004 | Derderian et al. |
| 2004/0163669 A1 | 8/2004 | Brueckner et al. |
| 2004/0180158 A1 | 9/2004 | Lin et al. |
| 2004/0206305 A1 | 10/2004 | Choi et al. |
| 2004/0219789 A1 | 11/2004 | Wood et al. |
| 2004/0222088 A1 | 11/2004 | Subramani et al. |
| 2004/0231798 A1 | 11/2004 | Gondhalekar et al. |
| 2004/0251130 A1 | 12/2004 | Liu et al. |
| 2004/0256226 A1 | 12/2004 | Wickersham |
| 2004/0261946 A1 | 12/2004 | Endoh et al. |
| 2005/0011749 A1 | 1/2005 | Kachalov et al. |
| 2005/0028838 A1 | 2/2005 | Brueckner |
| 2005/0048876 A1 | 3/2005 | West et al. |
| 2005/0061857 A1 | 3/2005 | Hunt et al. |
| 2005/0067469 A1 | 3/2005 | Facey et al. |
| 2005/0089699 A1 | 4/2005 | Lin et al. |
| 2005/0092604 A1 | 5/2005 | Ivanov |
| 2005/0098427 A1 | 5/2005 | Cho et al. |
| 2005/0147150 A1 | 7/2005 | Wickersham et al. |
| 2005/0150452 A1 | 7/2005 | Sen et al. |
| 2005/0161322 A1 | 7/2005 | Smathers |
| 2005/0172984 A1 | 8/2005 | Schweitzer et al. |
| 2005/0178653 A1 | 8/2005 | Fisher |
| 2005/0211548 A1 | 9/2005 | Gung et al. |
| 2005/0229849 A1 | 10/2005 | Silvetti et al. |
| 2005/0238807 A1 | 10/2005 | Lin |
| 2005/0252449 A1 | 11/2005 | Nguyen et al. |
| 2005/0271984 A1 | 12/2005 | Brueckner et al. |
| 2005/0282358 A1 | 12/2005 | Di Cioccio et al. |
| 2005/0284372 A1 | 12/2005 | Murugesh et al. |
| 2006/0005767 A1 | 1/2006 | Tsai et al. |
| 2006/0021870 A1 | 2/2006 | Tsai et al. |
| 2006/0060138 A1* | 3/2006 | Keller et al. ................ 118/715 |
| 2006/0070876 A1 | 4/2006 | Wu et al. |
| 2006/0090706 A1 | 5/2006 | Miller et al. |
| 2006/0105182 A1 | 5/2006 | Brueckner et al. |
| 2006/0108217 A1 | 5/2006 | Krempel-Hesse et al. |
| 2006/0188742 A1 | 8/2006 | West et al. |
| 2006/0251822 A1 | 11/2006 | Gell et al. |
| 2006/0283703 A1 | 12/2006 | Lee et al. |
| 2007/0059460 A1 | 3/2007 | Abney et al. |
| 2007/0062452 A1 | 3/2007 | Pancham et al. |
| 2007/0084408 A1 | 4/2007 | Yudovsky et al. |
| 2007/0102286 A1 | 5/2007 | Scheible et al. |
| 2007/0113783 A1 | 5/2007 | Lee et al. |
| 2007/0113868 A1 | 5/2007 | Fu et al. |
| 2007/0117397 A1 | 5/2007 | Fu et al. |
| 2007/0125646 A1 | 6/2007 | Young et al. |
| 2007/0170052 A1 | 7/2007 | Ritchie et al. |
| 2007/0173059 A1 | 7/2007 | Young et al. |
| 2007/0215463 A1 | 9/2007 | Parkhe et al. |
| 2007/0274876 A1 | 11/2007 | Chiu et al. |
| 2007/0283884 A1 | 12/2007 | Tiller et al. |
| 2008/0038481 A1 | 2/2008 | West et al. |
| 2008/0066785 A1 | 3/2008 | Vesci et al. |
| 2008/0110760 A1 | 5/2008 | Han et al. |
| 2008/0141942 A1 | 6/2008 | Brown et al. |
| 2008/0178801 A1 | 7/2008 | Pavloff et al. |
| 2008/0178807 A1 | 7/2008 | Wang et al. |
| 2008/0202688 A1 | 8/2008 | Wu et al. |
| 2008/0257263 A1 | 10/2008 | Pavloff et al. |
| 2008/0295872 A1 | 12/2008 | Riker et al. |
| 2009/0084317 A1 | 4/2009 | Wu et al. |
| 2009/0120462 A1 | 5/2009 | West et al. |
| 2009/0121604 A1 | 5/2009 | Stahr et al. |
| 2010/0012275 A1 | 1/2010 | Yamashita |
| 2011/0232845 A1* | 9/2011 | Riker et al. ................ 156/345.33 |

FOREIGN PATENT DOCUMENTS

| | | |
|---|---|---|
| EP | 0439000 | 7/1991 |
| EP | 0601788 | 6/1994 |
| EP | 0635869 | 1/1995 |
| EP | 0791956 | 8/1997 |
| EP | 0818803 A | 1/1998 |
| EP | 0838838 | 4/1998 |
| EP | 0845545 | 6/1998 |
| EP | 1049133 A2 | 11/2000 |
| EP | 1094496 A | 4/2001 |
| EP | 1 148 533 | 10/2001 |
| EP | 1148533 A2 * | 10/2001 |
| EP | 1158072 A2 | 11/2001 |
| EP | 1258908 A2 | 11/2002 |
| FR | 2562097 | 10/1985 |
| GB | 1424365 A | 2/1976 |
| JP | 54-162969 | 12/1979 |
| JP | 54162696 | 12/1979 |
| JP | 11-59368 | 12/1987 |
| JP | 63235435 | 9/1988 |
| JP | 02-027748 | 1/1990 |
| JP | 02-101157 | 4/1990 |
| JP | 03-138354 | 6/1991 |
| JP | 06-232243 | 8/1994 |
| JP | 07-197272 | 8/1995 |
| JP | 09-017850 | 1/1997 |
| JP | 09-272965 | 10/1997 |
| JP | 10-045461 | 2/1998 |
| JP | H10-106798 | 4/1998 |
| JP | 63149396 | 6/1998 |

(56) References Cited

FOREIGN PATENT DOCUMENTS

| | | |
|---|---|---|
| JP | 10-251871 | 9/1998 |
| JP | 10-330971 | 12/1998 |
| JP | 11-137440 | 5/1999 |
| JP | 11-220164 | 8/1999 |
| JP | 11-283972 | 10/1999 |
| JP | 2000-228398 | 10/1999 |
| JP | 2250990 | 10/1999 |
| JP | 11-345780 | 12/1999 |
| JP | 2000-072529 | 3/2000 |
| JP | 2000-191370 | 7/2000 |
| JP | 2002-69695 | 3/2002 |
| TW | 546680 | 8/2003 |
| WO | WO-9523428 | 8/1995 |
| WO | WO-9708734 | 3/1997 |
| WO | WO-9742648 | 11/1997 |
| WO | WO 98/01601 | 1/1998 |
| WO | WO-98/50599 | 11/1998 |
| WO | WO-9852208 | 11/1998 |
| WO | WO-9903131 | 1/1999 |
| WO | WO-9913126 | 3/1999 |
| WO | WO-9913545 | 3/1999 |
| WO | WO-9914788 | 3/1999 |
| WO | WO-99/17336 | 4/1999 |
| WO | WO-9928945 | 6/1999 |
| WO | WO-9941426 | 8/1999 |
| WO | WO-0005751 | 2/2000 |
| WO | WO 00/19495 | 4/2000 |
| WO | WO-0026939 | 5/2000 |
| WO | WO-0184590 | 11/2001 |
| WO | WO-0184624 A2 | 11/2001 |
| WO | WO 01-97270 | 12/2001 |
| WO | WO02/15255 | 2/2002 |
| WO | WO-0223587 | 3/2002 |
| WO | WO 02/093624 | 11/2002 |
| WO | WO-03015137 | 2/2003 |
| WO | WO-03057943 | 7/2003 |
| WO | WO-03076683 | 9/2003 |
| WO | WO-03083160 | 10/2003 |
| WO | WO-03087427 | 10/2003 |
| WO | WO-03090248 | 10/2003 |
| WO | WO-2004/010494 A2 | 1/2004 |
| WO | WO-2004012242 | 2/2004 |
| WO | WO-2004015736 | 2/2004 |
| WO | WO-2004074932 | 9/2004 |
| WO | WO-2004094702 | 11/2004 |
| WO | WO-2005021173 | 3/2005 |
| WO | WO 2005/071137 | 8/2005 |
| WO | WO-2006053231 | 5/2006 |
| WO | WO-2006073585 | 7/2006 |
| WO | WO-2007-030824 | 3/2007 |
| WO | WO 2008/079722 | 7/2008 |
| WO | WO-2008079722 | 7/2008 |
| WO | WO-2008-133876 | 11/2008 |
| WO | WO-2008-153785 | 12/2008 |
| WO | WO-2008/156794 | 12/2008 |
| WO | WO-2008/153785 A3 | 3/2009 |

OTHER PUBLICATIONS

Rosenberg, RW, "Increasing PVD Tool Uptime and Particle Control with Twin-Wire-Arc Spray Coatings", Mar. 2001, p. 103-105, 108, 11, vol. 19, No. 3, Cannon Comm., Santa Monica, CA.

Tucker, Jr., Robert C., "Plasma and Detonation Gun Deposition Techniques and Coating Properties," Union Carbide Corp., Coatings Service Dept., Indianapolis, IN, pp. 454-489.

Watanabe, et al., "Effect of Additives on the Electrostatic Force of Alumina Electrostatic Chucks," J. of the Ceramic Soc. of Jpn., 100(1):1-6 (1992).

Watanabe, et al., "Electrostatic Force and Absorption Current of Alumina Electrostatic Chucks," Jpn. J. Appl. Phy., 31(Pt1, No. 7):2145-2150 (1992).

Watanabe, et al., "Relationship Between Electrical Resistivity and Electrostatic Force of Alumina Electrostatic Chuck," Jpn. J. Appl. Phy., 32(Pt1, No. 2):864-871 (1993).

Watanabe, et al., "Resistivity and Microstructure of Alumina Ceramics Added with TiO2 Fired in Reducing Atmosphere," J. of the Ceramic Doc. of Jpn. Int. Ed., 101-1076-1083.

Wright et al., "Low Temperature Etch Chuck: Modeling and Experimental Results of Heat Transfer and Wafer Temperature," J. Vac. Sci. Technol. A, 10(4)1065-1070(Jul./Aug. 1992).

PCT/US2008/006702 International Preliminary Report on Patentability, Dec. 10, 2009.

PCT/US2008/006702 International Search Report, Jan. 7, 2009.

\* cited by examiner

SUBSTRATE CLEANING CHAMBER AND COMPONENTS

CROSS-REFERENCE

This application is a divisional of application Ser. No. 11/857,975, entitled "SUBSTRATE CLEANING CHAMBER AND COMPONENTS", filed on Sep. 19, 2007, which claims priority from provisional Ser. application No. 60/940,959, filed on May 30, 2007, both of which are incorporated by reference herein in their entireties.

BACKGROUND

In the processing of substrates such as semiconductors and displays, layers are formed on the substrate, and then etched to form features such as electrically conducting interconnects, contacts, vias, gates and barriers. For example, a pattern of electrical interconnect lines can be made by depositing a metal-containing conductor on the substrate, forming a patterned etch resistant material on the conductor, etching the conductor to form the interconnect lines, removing remnant resist, and depositing dielectric over the etched features. The dielectric layer can be further etched to form contact holes or vias that expose the underlying metal-containing conductor material or other substrate layers. Electrically conducting material is then deposited into the etched holes or trenches to electrically contact the underlying conductor. For example, in the formation of copper-containing interconnects, the dielectric layer can be etched to form contact holes that expose an underlying copper conductor material. A thin seed layer of copper can be deposited over the exposed conductor and contact hole to facilitate subsequent copper electroplating processes to fill the contact holes.

However, contaminants and undesirable surface material on the metal-containing conductor require cleaning of the exposed conductor surfaces before subsequent process steps are performed. For example, a native oxide film often forms on a conductor exposed to oxygen species during an intermediate process step, for example, during a resist stripping process in which an oxygen-containing gas plasma is used to strip resist, or when transferring the substrate between different chambers. The oxide films increase the electrical resistance at the contact interface between conductor surfaces. The surface material can also have residual process deposits from previous processes, such as for example carbon-containing, silicon-containing, fluorine-containing, and nitrogen-containing process residues. These process deposits can cause voids or other irregularities to form at the interface between the exposed and deposited materials.

Substrate cleaning chambers, also known as pre-clean chambers, are used to clean oxide films and other undesirable process deposits from the substrate surface prior to processing and in between processing steps. During the cleaning process, the substrate is supported in the cleaning chamber and an energized cleaning gas is formed in a remote gas chamber and introduced into the chamber. The cleaning gas reacts with and removes the surface residues. In some processes, the substrate heating pedestal includes a heating element to control the temperature of the substrate during cleaning.

However, one problem with the use of an energized cleaning gas in such cleaning processes is that it is difficult to control the energy of the radical and ionic species of the excited cleaning gas. Higher energy collisions between the cleaning gas and the substrate surface can cause damage to the underlying substrate. Lighter ions in the cleaning gas, such as for example $H^+$ can also be detrimental when they penetrate the surface of the substrate to damage underlying dielectric layers. Thus, it is desirable to control the energy of, and type of energized species introduced into the process chamber.

Another problem is that the cleaning gas often etches away and erodes the remote chamber wall surrounding the excitation region of the remote within a gas energizer, and can even etch and erode components inside the cleaning chamber. Such erosion damages these components, and if the component is an integral part of the chamber, the chamber must be shut down to allow the component to be refurbished or replaced after a predetermined number of process cycles, which is undesirable. Conventional stainless steel walls and liners are particularly susceptible to erosion and require frequent replacement or refurbishment.

Yet another problem occurs when the substrate heating pedestal in the cleaning chamber that contacts the substrate, transfers contaminants and process residues deposits to the backside of the substrate or even scratches the substrate during the substrate transferring process. Substrate heating pedestals containing heating elements can also provide non-uniform heating across the surface of the substrate. Substrate heating pedestals having a substrate receiving surface made up of raised mesas and grooves allow flow of a heat transfer gas behind the substrate to improve temperature uniformity but still transfer undesirable amounts of process residues and deposits to the substrate.

Thus, it is desirable to have a cleaning chamber and gas energizer that can selectively filter energized gas species, for example, to filter out certain ionic species from the cleaning gas. It is also desirable to have chamber components that can be easily replaced or refurbished. It is further desirable to have a substrate heating pedestal that minimizes contamination of the substrate by the transfer of process deposits to the backside surface of the substrate. It is also desirable to have a substrate heating pedestal that allows a more uniform heating of the substrate.

DRAWINGS

These features, aspects, and advantages of the present invention will become better understood with regard to the following description, appended claims, and accompanying drawings, which illustrate examples of the invention. However, it is to be understood that each of the features can be used in the invention in general, not merely in the context of particular drawings, and the invention includes any combination of these features, where:

SUMMARY

A consumable ceramic liner connects a gas outlet channel of a remote chamber to a gas inlet channel of a substrate cleaning chamber, the ceramic liner comprising an inlet cylinder having an outer diameter sized to fit in the gas outlet channel of the remote chamber; an outlet cylinder connected to the gas inlet channel of the substrate cleaning chamber; and a conical flare joining the inlet cylinder to the outlet cylinder.

A consumable ceramic liner for connecting a gas outlet channel of a remote chamber to a gas inlet channel of a substrate cleaning chamber, the ceramic liner composed of quartz in a thickness that is sufficiently thick to scavenge ion species from the energized gas generated in the remote gas energizer for at least about 30,000 process cycles.

A method of inserting the liner into a chamber lid of a process chamber to connect a gas outlet channel of a remote chamber to a gas inlet channel of a cleaning chamber, the method comprising:

(1) placing the liner locking cylinder over the outlet cylinder of the ceramic liner;
(2) passing a liner holding tool into the outlet cylinder of the ceramic liner so that the outer diameter of the liner holding tool grips an inner diameter of the outlet cylinder;
(3) grasping the liner holding tool and inserting the inlet cylinder of the ceramic liner into the gas outlet channel of the remote chamber; and
(4) twisting the liner holding tool to lock the liner locking cylinder.

A cleaning chamber comprising the liner, and further comprising a remote chamber to energize a gas therein, a substrate heating pedestal to hold a substrate, and an exhaust system.

DESCRIPTION

Figure 1:
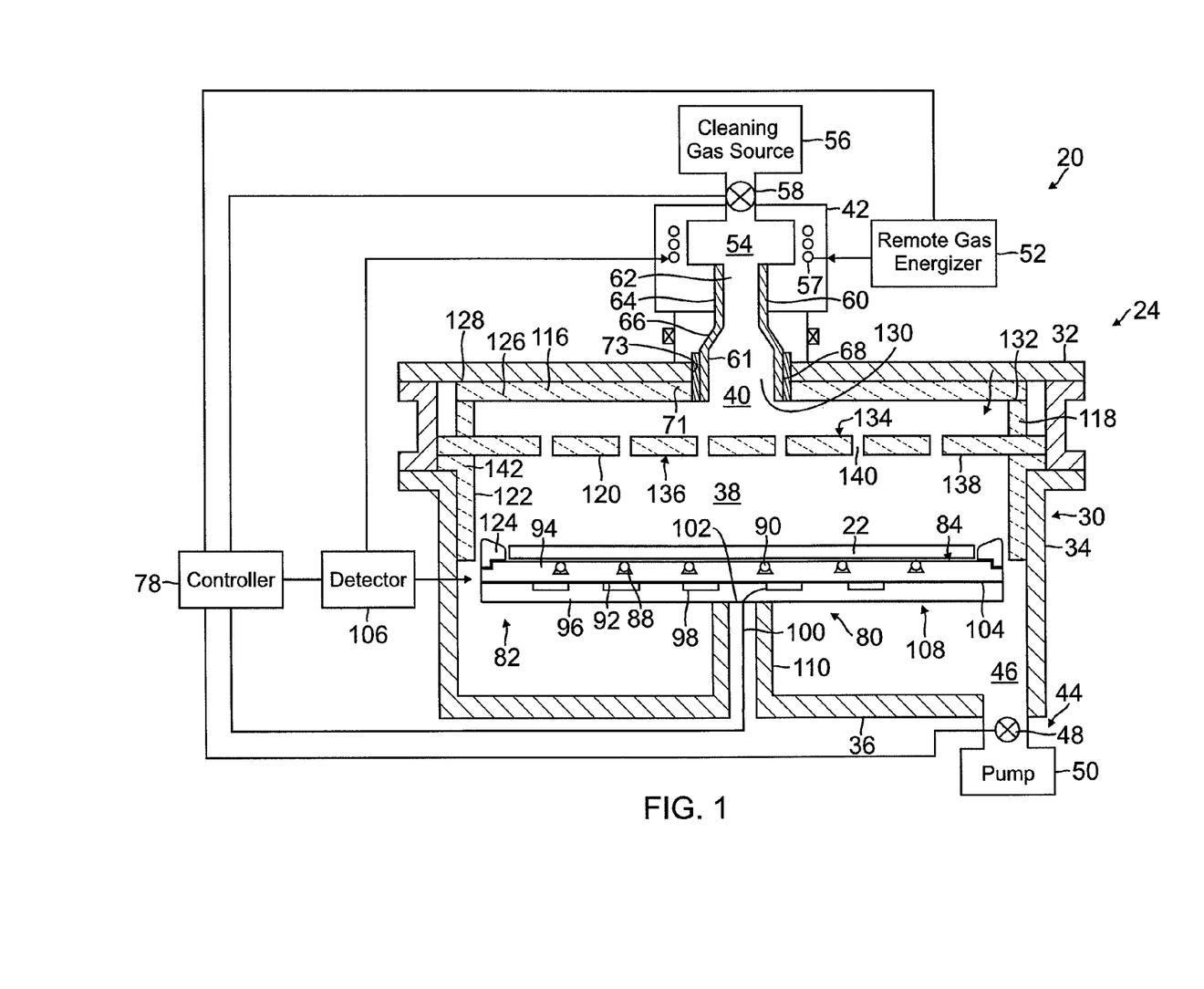
FIG. 1 is a sectional side view of an embodiment of a substrate processing apparatus comprising a substrate cleaning chamber.

An embodiment of a multi-chamber apparatus 20 comprising a cleaning chamber 24 suitable for cleaning a substrate 22, is shown in FIG. 1. The cleaning chamber 24, as shown, is suitable for cleaning substrates 22 such as semiconductor wafers; however, the cleaning chamber 24 can be adapted by those of ordinary skill to clean other substrates 22, such as flat panel displays, polymer panels, or other electrical circuit receiving structures. Thus, the scope of the present invention should not be limited to the illustrative embodiments of the cleaning chamber shown herein. Generally, the cleaning chamber 24 comprises one or more enclosure walls 30, which can include an upper wall 32, sidewalls 34, and a bottom wall 36, and which enclose a process zone 38. Energized cleaning gas is provided to a gas inlet channel 40 of the cleaning chamber 24 from a remote chamber 42. The cleaning gas reacts with the substrate 22 and other surfaces within the chamber 24. Spent gas and byproducts are exhausted from the chamber 24 through an exhaust system 44 which may include an exhaust port 46 that receives gas from the process zone 38, and can also include a throttle valve 48 to control the pressure of gas in the chamber 24, and one or more exhaust pumps 50, such as a turbo-molecular exhaust pump. The exhaust system 44 can be capable of maintaining a sub-atmospheric pressure in the chamber 24.

A remote chamber 42 suitable for remotely energizing the cleaning gas comprises a remote gas energizer 52 which couples energy to a gas energizer zone 54. A cleaning gas source 56 provides a cleaning gas to the gas energizer zone 54. A flow valve 58 can be provided to control a flow rate of the cleaning gas into the remote chamber 42. The gas energizer 52 couples energy to the cleaning gas in the gas energizer zone 54 to form an energized cleaning gas comprising ionic and radical species. The gas energizer 52 can couple, for example, RF or microwave energy to the cleaning gas. In one version, the remote gas energizer 52 comprises an inductor antenna 57 that inductively couples RF energy to the cleaning gas in the gas energizer zone 54 at a power level of, for example, from about 100 Watts to about 10 kWatts. The gas energizer 52 can also be a toroidal gas energizer to couple energy to the cleaning gas in the remote zone 54, as for example described in U.S. Pat. No. 6,150,628 to Smith et al., which is incorporated by reference herein and in its entirety. A suitable RF power level applied by the toroidal gas energizer may be from about 1000 Watts to about 10,000 Watts. A remote gas energizer 52 comprising a microwave gas activator providing a microwave power level of from about 300 Watts to about 5 kW, can also be used.

Figures 2A, 2B:
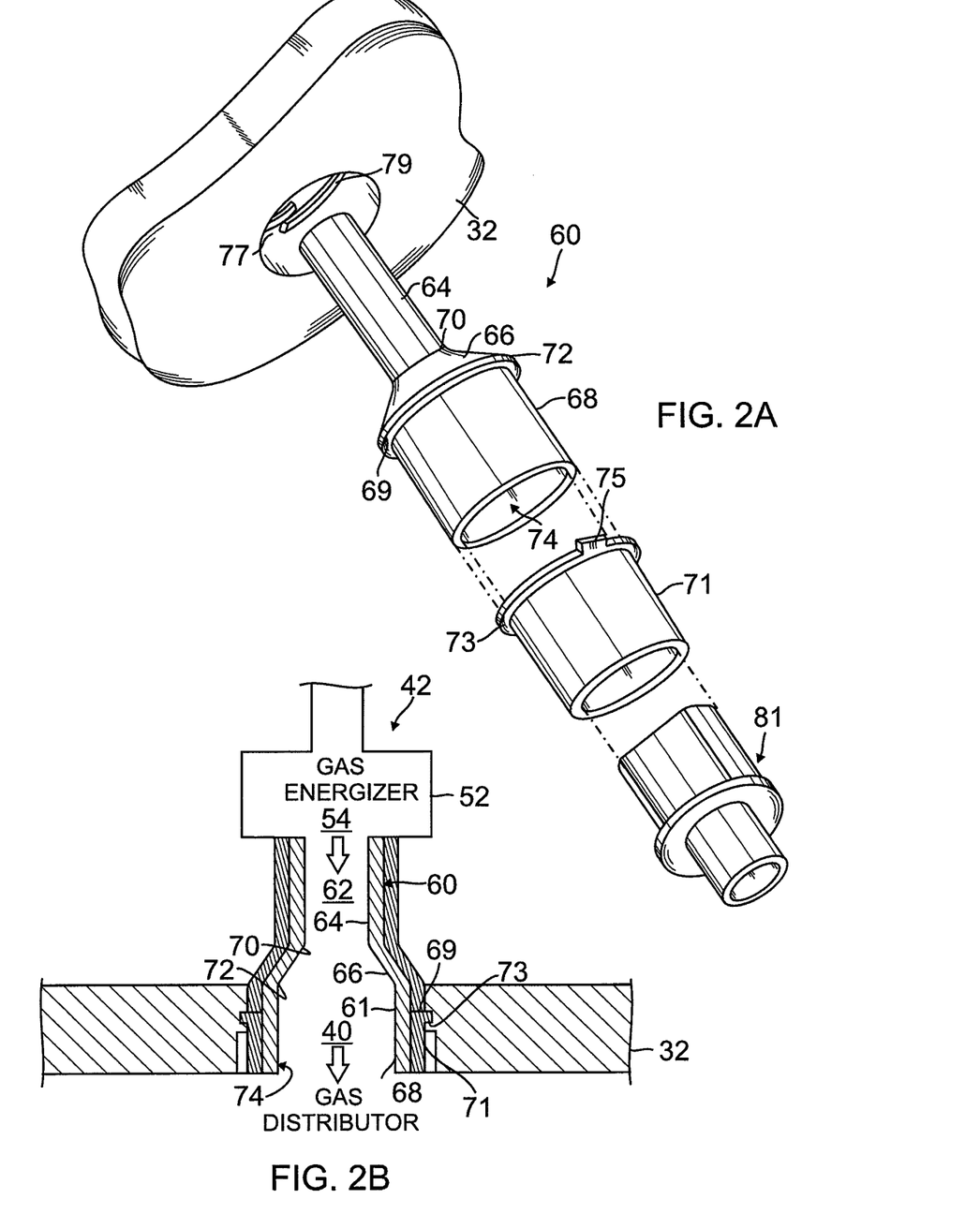
FIG. 2A is an exploded perspective view of a consumable ceramic liner being fitted into a top plate of the cleaning chamber using a liner locking cylinder and liner holding tool.
FIG. 2B is a schematic side view of the ceramic liner and liner locking cylinder fitted into the top plate of the cleaning chamber.

A consumable ceramic liner 60 connects a gas outlet channel 62 of the remote gas energizer 52 to a gas inlet channel 40 of the chamber 24, as shown in FIGS. 2A and 2B. The liner 60 serves to protect the channels 40, 62 by covering their inner surfaces with at least a portion of the surface of the liner 60, such that the inner surface 61 of the liner 60 is exposed to the energized gas species. The liner 60 comprises an inlet cylinder 64 having an outer diameter sized to fit in the gas outlet channel 62 of the remote gas energizer. In one version, the inlet cylinder 64 has a length L that is sufficiently long to extend out from the remote chamber 42 by a distance of at least about 50 mm. The length L is sufficiently short to terminate at least about 1 mm before the end of the gas inlet 40 of the chamber 24. In one version, the inlet cylinder 64 has a length L of from about 100 to about 110 mm, and a diameter of between about 1 cm to about 4 cm.

A conical flare 66 joins the inlet cylinder 64 to an outlet cylinder 68. The conical flare 66 comprises a tube having a diameter that increases along a conical surface over the length of the flare 66. The conical flare 66 has an upper end 70 and a lower end 72. The outer diameter of the upper end 70 of the conical flare 66 is sized to correspond to the outer diameter of the inlet cylinder 64 at the junction between the conical flare 66 and the inlet cylinder 64. The outer diameter of the lower end 72 of the conical flare 66 is sized to correspond to the outer diameter of the outlet cylinder 68 at the junction between the conical flare 66 and the outlet cylinder 68. The diameter of the lower end 72 of the conical flare 66 is larger than the diameter of the upper end 70 of the conical flare 66 by at least a factor of 1.5. In one version the inlet cylinder 64, the conical flare 66 and the outlet cylinder 68 are integrally connected.

The conical flare 66 serves to gradually increase the diameter of the inner volume of the liner 60 between the upper and lower ends 70, 72 to provide a more uniform distribution of energized gas species entering the process chamber. An abrupt change in diameter was believed to result in non-uniform gas distribution from the outlet of the liner. The conical flare 66 gradually tapers the diameter from the first diameter of the inlet cylinder 64 to the second diameter of the outlet cylinder 68 to provide a gradual increase in volume along the flow path of the dissociated gas species. In one version, the conical flare 66 comprises a conical surface that is angled relative to a vertical axis passing through the centerline of the conical flare, at an angle of from about 10 degrees to about 60 degrees. Also, the ratio of the length of the conical flare 66 to the length of the outlet cylinder 68 is from about 1:2 to about 1.8. Spacing the increase in volume across a length of the conical flare 66 provides better distribution of gas species at the outlet end 72 of the conical flare 66.

The liner 60 also has an outlet cylinder 68 that is connected to the gas inlet channel 40 of the substrate cleaning chamber 24. In one version, the outlet cylinder 68 has an outer diameter sized to fit in the gas inlet channel 40 of the substrate cleaning chamber 24. The outlet cylinder 68 has a length L that is sufficiently short to terminate before a process zone of the cleaning chamber 24 to avoid erosion in the chamber environment. When the inlet cylinder 64 has a first diameter, the outlet cylinder 68 comprises a second diameter that is at least 1.5 times larger that the first diameter. In one version, the outlet cylinder 68 has a diameter of from about 2 cm to about 8 cm or more typically about 4 cm. The outlet cylinder 68 protects the inner surfaces of the gas inlet 40 of the chamber from erosion by the energized gas species, while also increasing the diameter of the liner to reduce collisions between the energized gas species formed in the remote zone 54.

The consumable liner 60 comprises a ceramic material capable of scavenging an ion species from the energized gas generated in the remote gas energizer. For example, the liner 60 can comprise quartz, aluminum oxide or aluminum nitride. In one version, the liner 60 comprises quartz and is capable of scavenging hydrogen ions from the energized gas by adsorbing some of the hydrogen ions onto its inner surface 74. The quartz inner surface 74 is believed to act as an ion filter 76 to reduce the recombination of the radicals by providing a surface to which hydrogen-containing species can adsorb. It is also believed that hydrogen-containing species that impinge on the quartz surface 74 release an adsorbed hydrogen-containing radical into the energized gas thereby regenerating free hydrogen radicals. However, hydrogen ions are not regenerated by the quartz surfaces 74, and thus, the hydrogen ions impinging on the quartz surface recombine to form electrically neutral, non-ionic species. Thus, passing the activated or energized cleaning gas over the quartz surface 74, causes ionic species to be filtered out from the energized cleaning gas while hydrogen radicals are preserved.

The thickness of the consumable liner 60 is selected depending upon the number of process cycles the liner must withstand before replacement. The energized gas is capable of etching and eroding the liner 60, thus, the liner 60 must be replaced after a predetermined number of process cycles. Also, the adsorption properties of the liner 60 degrade as more and more ions are adsorbed onto the surface of the ceramic liner. The number of cycles that the liner 60 can withstand is related to the thickness of the liner 60. In one version, the liner 60 is sufficiently thick to scavenge ion species for at least about 30,000 process cycles, and has a thickness of from about 2 mm to about 6 mm.

The liner 60 can be made by molding a ceramic powder into the desired shape, for example, by cold isostatic pressing. For example, ceramic powder is combined with a liquid binding agent such as the organic binding agent polyvinyl alcohol. The mixture is placed in a rubber bag of an isostatic pressing device and a pressure is uniformly applied on the walls of the bag to compact the mixture to form a ceramic structure having the desired tubular shape. The pressure can be applied, for example, by immersing the flexible container in water or by other pressurizing methods. The molded ceramic preform can be made cylindrical or ring-like using a hollow tube mold, and the resultant molded ceramic preform can be further shaped by machining. The shaped ceramic preform is then sintered to form a sintered ceramic. For example, aluminum oxide can be sintered at a temperature of from about 1300° C. to about 1800° C. for about 48 to about 96 hours, typically at a pressure of about 1 atm. The sintered ceramic material can be further shaped, for example, by machining, polishing, laser drilling, or using other methods, to provide the desired ceramic structure.

The liner 60 is held in place in the chamber by a liner locking cylinder 71. The liner locking cylinder 71 is sized to slide over the outer diameter of the outlet cylinder 68 of the liner 60 and it rests against an annular lip 69 of the outlet cylinder 68. as shown in FIGS. 2A and 2B. The liner locking cylinder 71 fits in between the outer cylinder 68 of the liner 60 and the aperture wall 73 to form a gas tight seal as shown in FIG. 1, and can b made from a metal or ceramic material.

Advantageously, the liner locking cylinder 71 facilitates placement into the upper chamber wall 32, and also facilitates removal of the liner 60 after it is exposed to plasma for a preset number of process cycles, for refurbishment or replacement. The liner locking cylinder 71 comprises a circular flange 73 which extends out from one end of the locking cylinder 71. The circular flange 73 has a flat key 75 which is inserted into a matching flat key portion 77 on an annular lip 79 extending out from the upper chamber wall 32, as shown in FIG. 2B. Twisting the liner locking cylinder 71 rotates the circular flange 73 so that it slides behind the annular lip 79 of the upper chamber wall 32 to lock the circular flange behind the same. A locking blocker (not shown) such as a locking pin can be inserted into the pathway of the rotating circular flange 73 to block and stop the flange from further rotation.

A method of inserting the liner 60 into a chamber lid for connecting a gas outlet channel 62 of a remote chamber 42 to a gas inlet channel 40 of a cleaning chamber 24 is also demonstrated in FIG. 2B. In this method, the liner locking cylinder 71 is first placed over the outlet cylinder 68 of the ceramic liner 60. Then, a liner holding tool 81 is passed into the outlet cylinder 68 of the ceramic liner 60 so that the outer diameter of the liner holding tool 81 grips the inner diameter of the outlet cylinder 68. A user grasps the liner holding tool 81 and then inserts the inlet cylinder 64 of the ceramic liner 60 into the gas outlet channel 62 of the remote chamber 42. The liner holding tool 81 is then twisted to lock the circular flange 73 of the liner locking cylinder 71 into a matching annular lip 79 of the upper chamber wall 32 as described.

The chamber 24 may also optionally comprise a chamber gas energizer (not shown) that couples energy to the gas in the process zone 38 of the chamber 24. For example, the chamber gas energizer can comprise one or more of electrodes and an inductor antenna to couple RF energy.

A substrate heating pedestal 80 is provided to hold the substrate 22 in the process zone 38 of the substrate cleaning chamber 24 as shown in FIGS. 1, 3A, 3B and 4B. The pedestal 80 comprises an annular plate 82 having a substrate receiving surface 84 with an array of recesses 88 and a heating element 92 embedded in the annular plate 82. The heating element 92 is controlled by a controller 78. The controller 78 is able to supply a variable power level to the heating element 92 in response to at least one of: input from one or more detectors 106 that monitor the conditions in the cleaning chamber 24 or the remote chamber 42, or input from a user of the apparatus 20. The pedestal 80 can optionally comprise an electrode (not shown) that can be electrically biased to hold the substrate 22 to the pedestal 80 or affect the characteristics of the process, such as the degree of ion bombardment of the substrate 22. The bias applied to the electrode is also controlled by the controller 78.

Figure 3A:
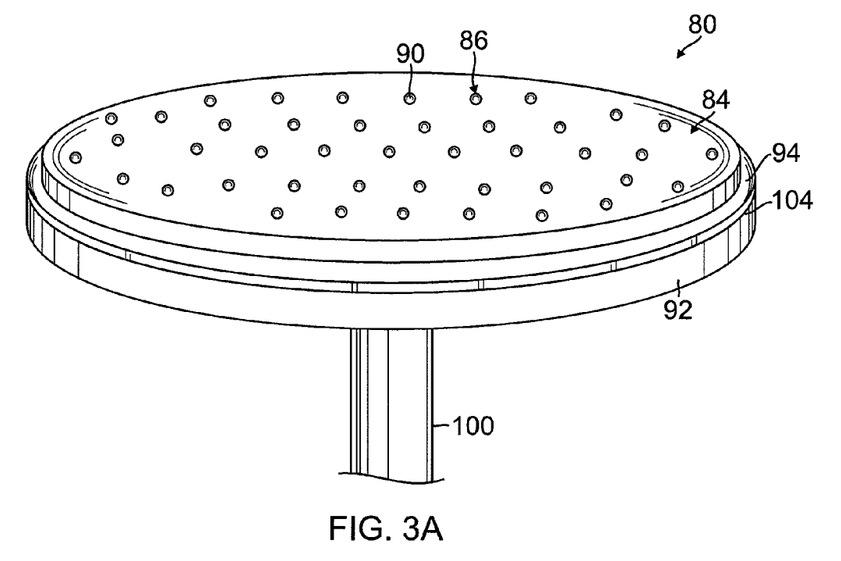
FIG. 3A is a perspective view of a substrate heating pedestal having ceramic balls embedded in the substrate receiving surface.

A plurality of ceramic balls 90 are each positioned in a recess 88 on the substrate receiving surface 84 as shown in FIG. 3A. The ceramic balls 90 are embedded in the surface 84 of the pedestal 80 such that a portion of the surface of each ball 90 is situated above the plane of the pedestal surface 84. As such, a top region 144 of the balls 90 make up a raised substrate receiving surface 86 consisting of N discrete regions, where N is the number of balls 90 embedded in the surface 84 of the pedestal 80. The raised substrate receiving surface 86 is vertically separated from the pedestal surface 84. That is, the raised substrate receiving surface 86 is higher than the surface of the annular plate 82 by from about 0.01 mm to about 0.5 mm. Supporting the substrate 22 by a series of discrete points, and at a vertical distance from the surface of the annular plate 82 of the heating pedestal 80 allows for gas in the chamber 24 to transfer heat between the substrate 22 and the surface of the annular plate 82 during heating. Suspension of the substrate 22 above the surface of the annular plate 82 allows for a more uniform heating of the substrate 22, as compared to contacting the substrate 22 to the surface of the annular plate 82, because the thermal contact is not directly affected by local variations in the thermal conductivity and surface contact characteristics of the plate 82.

In one version, the ceramic balls 90 are spherical in shape and the diameter of the balls 90 is sufficiently high to maintain the substrate receiving surface higher than the top surface of the annular plate by from about 0.01 mm to about 0.5 mm. Typically, the balls 90 comprise a diameter of between about 1 mm and about 3 mm. In one version, the spherical bodies have a diameter of about 2 mm and protrude from the upper surface of the annular plate 82 by about 0.04 mm. The ceramic balls 90 comprise at least one of silicon nitride, zirconium oxide, sapphire, synthetic corundum, and alumina oxide and in one version comprise alumina oxide.

Figure 3B:
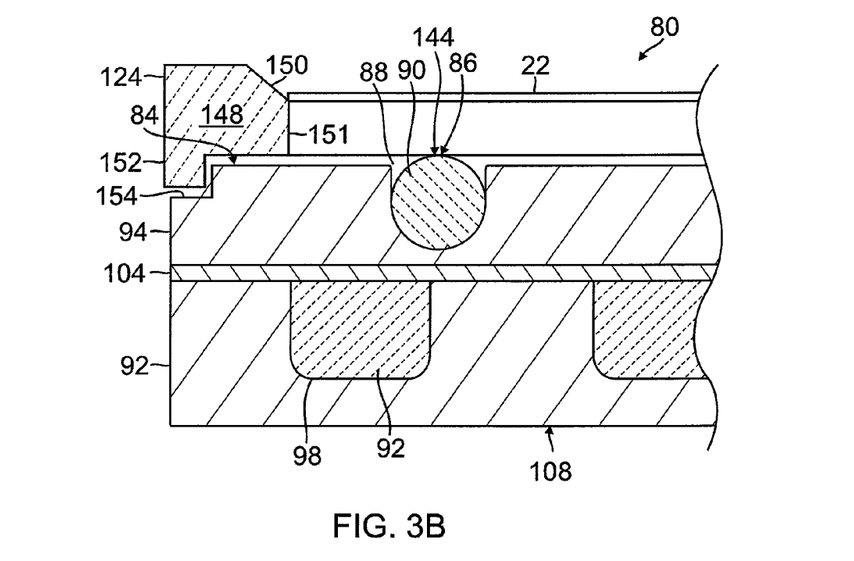
FIG. 3B is a cross sectional schematic view of the substrate heating pedestal of FIG. 3A having first and second discs with a brazed bond, and an embedded heating element.

The annular plate 82 is constructed from two disks 94, 96 which are bonded together with a brazed bond. In one version, as shown in FIGS. 3A and 3B, the annular plate 82 comprises a first disk 94 having the raised substrate receiving surface 86. The first disk 94 comprises a thickness of from about 10 mm to about 30 mm and diameter of from about 10 cm to about 70 cm. The diameter of the disk 94 is dependant on the dimensions of the substrate to be processed. The receiving surface of the disk 94 comprises a plurality of recesses 88 each having a diameter and a depth sufficient to receive a ceramic ball 90. The recesses 88 can be formed by machining and preferably comprise sides which are sloped inward by between about 2 and about 20 degrees such that the diameter of the recess 88 at the surface of the first disk is slightly less than the diameter of the ceramic ball 90. Recesses 88 machined in this manner are capable of confining the inserted ceramic balls 90 to the surface of the annular plate 82 after insertion.

A second disk 96 is provided having a diameter to match the diameter of the first disk 94 and a thickness of between about 6 mm and about 15 mm. The second disk 96 comprises a channel 98 shaped to receive the heating element 92 and is made of at least one of aluminum, copper, titanium, molybdenum or stainless steel, or combinations thereof. In one version, the second disk comprises aluminum, and the brazing bond material comprises an aluminum brazing material. The heating element 92 comprises a resistor assembly having sufficient electrical resistance to maintain the surface 84 of the annular plate 82 at temperatures of from about room temperature to about 400° C. The heating element 92 is powered via terminal posts 100 which extend through the second disk 96 about the center 102 of the disk.

The annular plate 82 with embedded heating element 92 may be formed by machining a first disk 94 from an aluminum sheet having a thickness of about 5 mm. Recesses 88 having a depth of about 2 mm from the surface 84 of the first disk 94 are drilled into the surface 84 of the disk 94 corresponding to the desired placement of the countersunk ceramic balls 90. A second disk 96 is machined to have the same diameter as the first disk 94 from an aluminum sheet having a thickness of from about 11.5 mm to about 12.5 mm. A serpentine channel 98 is machined in the disk 96, the channel 98 having a width and depth corresponding to the dimensions of the heating element 92. At least one pair of holes (not shown) are drilled about the center 102 of the second disk 96. The drilled holes have a diameter of at least 10% greater than the diameter of the terminals 100 of the heating element 92. The heating element 92 is applied to the grooved side of the second disk 96 by pressing it into the channel 98 and threading the terminals 100 through the drilled holes. A brazing foil or brazing compound is placed onto the grooved surface of the second disk 96 such that it covers the surface of the second disk 96. The non-pitted side of the first disk 94 is held onto the brazing surface and the assembly is aligned such that the circumferences of the first and second disks 94, 96 overlap with each other. The assembly is bonded together by placing the assembly in a furnace, heating the assembly to above the melting point of the brazing material and applying pressure, such as in a hot press. The assembly is then cooled to form a brazed bond 104.

The backside surface of the annular plate 82 is mounted to a support post 110 used for supporting the annular plate 82. The support post 110 comprises a rod having a receiving surface adapted to receive the backside surface of the annular plate 82. The rod may comprise a metal such as stainless steel or aluminum and may be a solid or a hollow structure. In one version, the support post 110 also comprises a bellows and a lift mechanism (not shown) that is adapted to raise and lower the pedestal 80 into position for receiving a substrate 22, treating the substrate 22 and removing the substrate 22 from the chamber 24. The method of fastening the annular plate 82 to the support post 110 can comprise welding the support post 110 to the bottom surface of the annular plate 82, welding a threaded adapter to the bottom surface of the annular plate 82 and then screwing the annular plate 82 to the support post 110 or by welding a hollowed tube onto the bottom surface of the annular plate 82 and then clamping the hollowed tube to the support post 110.

Figure 4A:
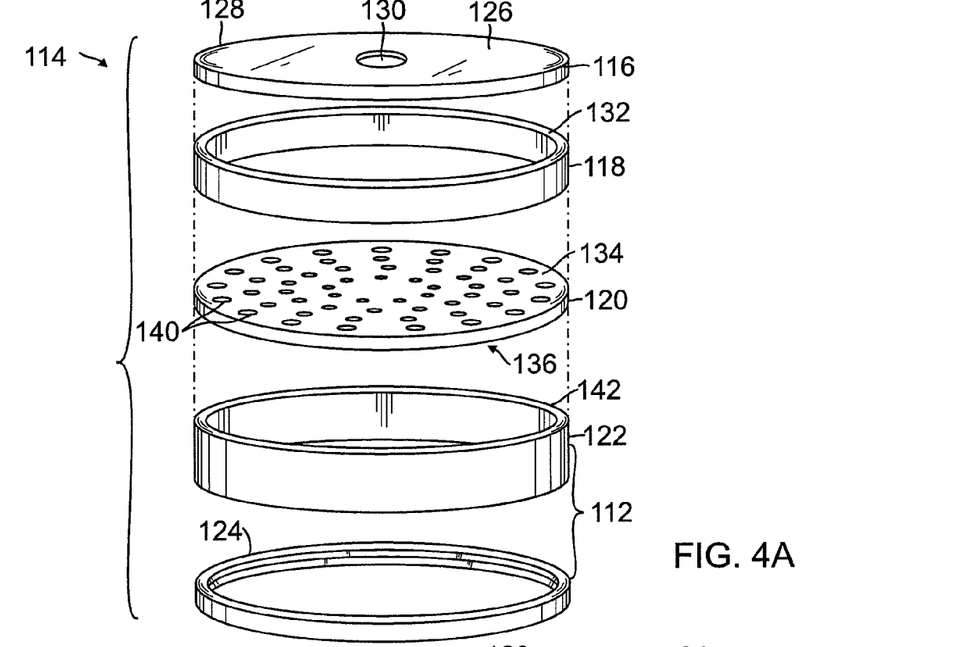
FIG. 4A is an exploded perspective view of a process kit and gas distributor plate.
Figure 4B:
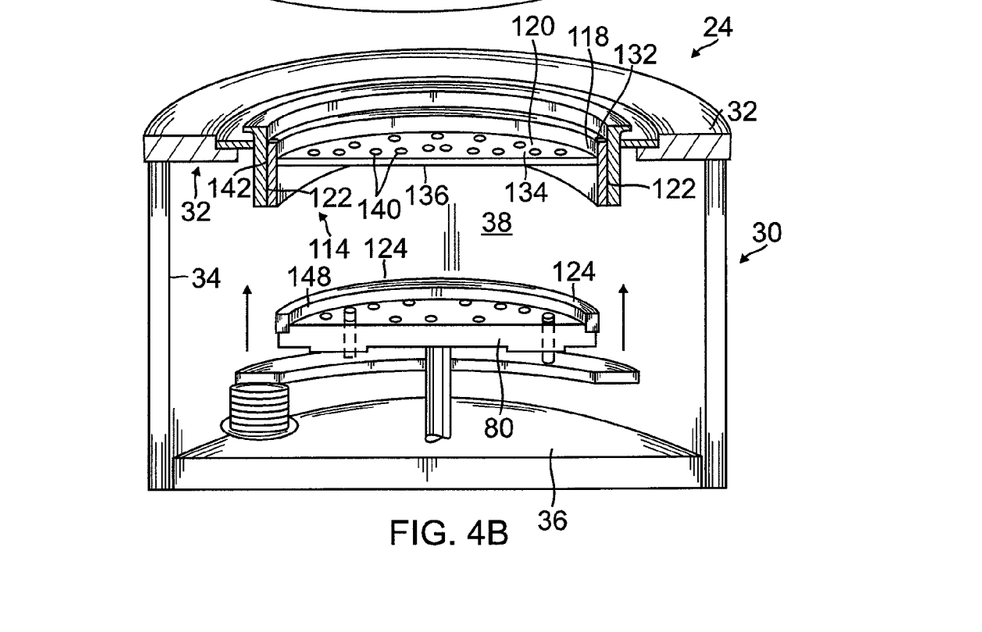
FIG. 4B is a schematic partial sectional view of the process kit, gas distributor plate and substrate heating pedestal in a cleaning chamber.

A process kit 114 comprising several components 112 is provided to contain the energized gas into the cleaning chamber 24 and distribute the gas across the substrate surface as shown in FIGS. 4A and 4B. The components 112 of the process kit 114 can include, for example, a top plate 116, a top liner 118, a gas distributor plate 120, a bottom liner 122, and a focus ring 124. The components 112 of the process kit 114 can be easily removed from the chamber 24, for example, to replace or repair eroded components, or to adapt the cleaning chamber 24 for processing substrates 22 of different sizes. The process kit 114 components can be made from quartz because quartz is effective at reducing the recombination rate of process gas radicals such as hydrogen radicals.

The top plate 116 comprises an annular disk 126 having an outer peripheral edge 128 and an orifice 130 for passing process gas therethrough as illustrated in FIG. 4A. The top plate 116 is sized to fit into the substrate cleaning chamber 24 and the orifice 130 has a diameter of between about 40 mm and about 45 mm and is located about the center of the top plate 116 such that the orifice 130 substantially overlaps with the gas inlet channel 40 of the upper chamber wall 32. The top plate 116 contacts the upper wall 32 of the chamber 24. The top plate 116 contacts and is supported by the top liner 118. The top plate 116 comprises a thickness of from about 1 mm to about 10 mm.

The top liner 118 contacts the outer peripheral edge 128 of the top plate 116. The top liner 118 comprises a cylinder that serves to confine the energized process gas and to protect the walls 30 of the cleaning chamber 24 from the energized process gas. The liner 118 comprises a thickness of from about 0.60 cm to about 0.70 cm. In one version, the outer peripheral edge 128 of the top plate 116 rests on the upper edge 132 of the top liner 118.

Figure 4C:
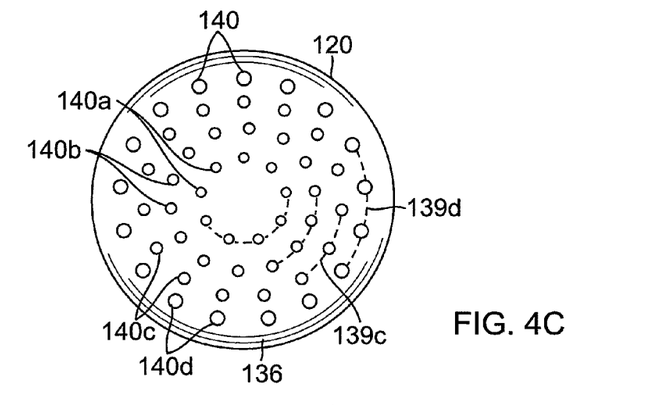
FIG. 4C is a top view of the gas distributor plate.

A gas distributor plate 120 has a top surface 134 contacting the top liner 118, a bottom surface 136, and a plurality of holes 140 therethrough for distributing process gas in the chamber 24. The holes 140 are shaped, sized, and distributed in a spaced apart relationship across the surface of the plate 120 to promote uniform delivery of the process gas to the surface of the substrate 22. In one version, the plurality of holes 140 comprises four rings 139a-d of holes 140a-d that are each sized with different diameters as shown in FIG. 4C. In one version, the innermost first ring 139a of first holes 140a that are sized with a diameter d. A second ring 139b of second holes 140b that each have a diameter 2 d, are located radially outward of the first ring 139a. A third ring 139c of third holes 140c that each have a diameter 3 d are radially outward of the second ring 139b. A fourth ring 139d of fourth holes 140d that each have a diameter 4 d are being radially outward of the third ring 139c. Such a distribution of holes 140a-d provides more uniform delivery of the process gas to the surface of the substrate 22. In one version, the first holes 140a have a diameter d which is from about 1 to about 5 mm, and the other holes 140b-d are sized accordingly. As one example, the first ring of holes 140a each have a diameter of from about 1 to about 5 mm; the second ring of holes 140b each have a diameter of from about 2 to about 10 mm; the third ring of holes 140c each have a diameter of from about 3 to about 15 mm; and the fourth ring of holes 140a each have a diameter of from about 4 to about 20 mm. In one version, the different diameter holes 140a-d are also spaced apart to include a larger number of holes on the fourth ring 139d, and progressive smaller numbers of holes for the third ring 139c, second ring 139b, and first ring 139a. The gas distributor plate 120 can be composed of a ceramic, such as for example, aluminum oxide or silicon oxide, and the silicon oxide can be quartz.

A bottom liner 122 contacts the bottom surface 136 of the gas distributor plate 120 as shown in FIGS. 4A and 4B. The bottom liner 122 also comprises a cylinder having an annular peripheral edge 142 that extends outward from the cylinder. The peripheral edge 142 contacts the bottom surface 136 of the gas distributor plate 120 and the sidewall 34 of the cleaning chamber 24.

A focus ring 124 is provided to focus the energized process gas onto the substrate 22. The focus ring 124 comprises an inner flange 148 which rests on the peripheral edge of the support pedestal 80 and which has a sloped upper surface 150 joining a vertical surface 151 at the substrate periphery, as shown in FIGS. 3B and 4B. The sloped upper surface 150 comprises an angle of between about 85 to about 100°, for example about 95°. The focus ring 124 also has a foot 152 which is elevated about a outer ledge 154 of the substrate heating pedestal 80.

The process kit 114 components described above can comprise a filtering material, such as for example quartz, to adsorb ionic species from the energized gas to filter out the ionic species from the energized gas. In one version, at least a portion of the surfaces of the top plate 116, top liner 118, gas distributor plate 120, bottom liner 122 and focus ring 124 comprises quartz, for example a coating of quartz. The quartz can be deposited onto the surfaces of these process kit 114 components by physical vapor deposition or by hydrothermal deposition. A suitable thickness for a layer of quartz on these surfaces is from about 0.01 mm to about 4 mm. In one version, the process kit 114 components 112 are composed of quartz.

The quartz surfaces 74 can be arranged to provide optimal filtering of the hydrogen ion species from the energized cleaning gas. In one version, the quartz surfaces 74 comprise the interior surface of a portion of the ceramic liner 60 that connects the gas energizer zone 54 and the cleaning chamber 24. For example, the ceramic liner 60 can comprise a quartz tube. In another version, the quartz surface 74 comprises one or more surfaces of a gas distributor, such as for example the upper surface of the gas distributor plate 120. The quartz surfaces may also comprise a wire grid situated between the remote zone and the substrate, for example above the process zone, to further filter the activated cleaning gas.

In one cleaning process performed in the cleaning chamber 24 of apparatus 20, the temperature of the substrate 22 is set to provide optimum conditions for the reduction of oxides in the deposits, and can even be set to accelerate the chemical reaction between the hydrogen-containing radicals and the deposits. For example, the temperature of the substrate 22 may be maintained at from about 0 to about 500° C., such as from about 150° C. to about 450° C., and even from about 25° C. to about 350° C., such as from about 150° C. to about 350° C. In one version, a bias power level applied to the substrate 22 during the cleaning process may be desirably low, as a high bias power level can increase the bombardment of the substrate 22 by ions in the energized cleaning gas. A suitable bias power level may be less than about 100 Watts such as, for example, from about to about 0 to about 10 Watts, and even from about 1 to about 10 Watts, and may even be substantially zero. In another version, a higher bias power level may be applied to increase the rate of cleaning, such as a bias power level of greater than 100 Watts, and even from about 100 Watts to about 200 Watts.

It has further been discovered that cleaning of the substrate 22 can be improved by performing a heat treatment or annealing step to remove deposits from the substrate 22. In the heat treatment step, the substrate 22 is heated to a temperature that is sufficiently high to vaporize material from the substrate 22. A flow of a reducing gas may also be provided during the heat treatment step to inhibit the formation of oxides on the substrate 22. A suitable reducing gas may comprise a hydrogen-containing gas, such as for example $H_2$. The heat treatment step can be performed without substantially energizing the reducing gas, for example without substantially coupling RF or microwave energy to the reducing gas, to provide a relatively gentle initial clean of the substrate 22 prior to the energized hydrogen radical cleaning step.

In one version of a suitable cleaning process, a cleaning gas comprising from about 50 to about 1000 sccm of $H_2$, such as 300 sccm of $H_2$, and from about 0 to about 10 sccm $H_2O$, such as 3 sccm $H_2O$ is activated in the chamber 42 of the remote gas energizer 52 by applying a power level of from about 300 Watts to about 3000 Watts, such as 1050 Watts. The remote chamber 42 pressure is maintained at less than about 10 Torr, such as about 1 Torr. A bias power level of from about 0 to about 100 Watts, such as 50 Watts is applied to bias the substrate 22, and the temperature of the substrate 22 is maintained at from about 150 to about 450° C., such as 250° C. The cleaning process substantially removes the deposits to provide a cleaned surface.

After the cleaning process has been completed, the pressure in the chamber 24 is reduced to a pressure of less than about 10 mTorr, to evacuate spent cleaning gas and cleaning by-products and to reduce the likelihood of contamination of the multi-chamber apparatus 26 by the cleaning chamber 24. The substrate 22 can then be transferred under vacuum via a substrate transfer chamber having a transfer robot 119 to a deposition chamber 24b to deposit a second metal-containing conductor 21, such as at least one of copper, aluminum, tantalum, tungsten, tantalum nitride and tungsten nitride, on the freshly cleaned metal-containing conductor surface.

Figure 5:
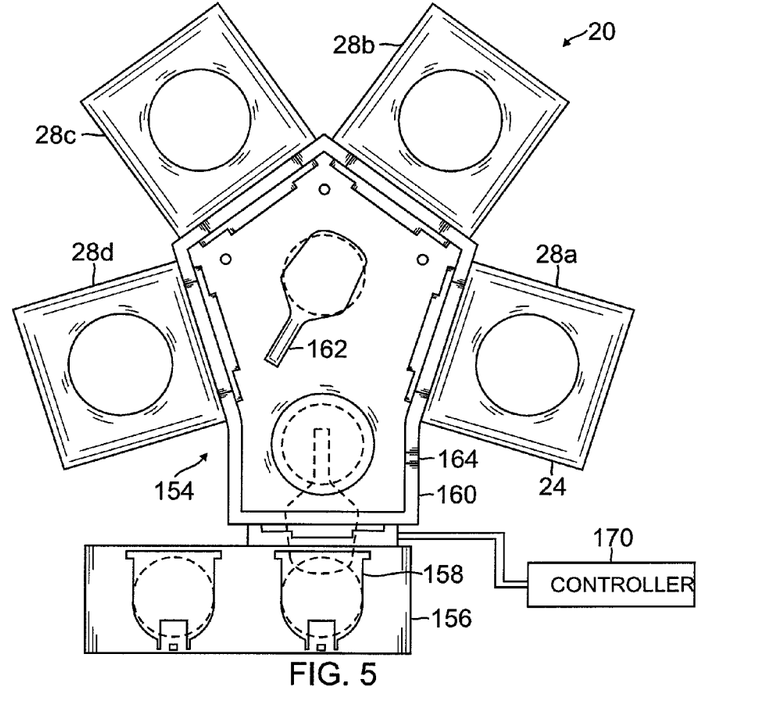
FIG. 5 is a schematic view of a substrate processing apparatus comprising a substrate cleaning chamber.

A multi-chamber apparatus 20 suitable for processing substrates 22 comprises one or more process chambers 28a-d which can include the cleaning chamber 24, as shown in FIG. 5. The chambers are mounted on a platform that provides electrical, plumbing, and other support functions. The platform typically supports a load lock 156 to receive a cassette 158 of substrates 22 to be processed and a substrate transfer chamber 154 containing a robot 162 to transfer substrates 22 from the cassette 158 to the different chambers 28a-d for processing and return them after processing. The different chambers 28a-d may include, for example, a cleaning chamber 24, a deposition chamber 28b for depositing materials on wafers, optionally, a heat treatment chamber 28c, and other processing chambers. For example, in one version, one of the chambers comprises the cleaning chamber 24 for removing deposits formed on a metal-containing conductor on the substrate 22. After the cleaning process is finished, the substrate 22 can be transferred by the robot 162 to a deposition chamber 28d to deposit material such as a metal-containing conductor on the cleaned substrate 22. The substrate 22 can also be transferred by the robot 162 to a second deposition chamber 28c capable of depositing another material, such as another metal-containing conductor, over the first material deposited in the first chamber 28b. The chambers 28a-d are interconnected to form a continuous vacuum environment within the walls 164 of the substrate transfer chamber 154 to provide as process which may proceed uninterrupted and reducing contamination of substrates 22. The transfer chamber 154 comprises a wall 160 having an exhaust port 164 to exhaust gases and to maintain a low pressure environment, such as a pressure of less than about 10 mTorr, in order to reduce contamination of the chambers.

The multi-chamber apparatus 26 can be operated by a controller 170 via a hardware interface. The controller 170 comprises a computer (not shown) having a central processor unit (CPU) that is coupled to a memory and peripheral computer components. Preferably, the memory may include a removable storage media, such as for example a CD or floppy drive, a non-removable storage media, such as for example a hard drive, and random access memory. The controller 170 may further comprise a plurality of interface cards including, for example, analog and digital input and output boards, interface boards, and motor controller boards. In one version, the controller 170 comprises a computer-readable program may be stored in the memory, for example on the non-removable storage media or on the removable storage media. The computer readable program generally comprises process control software comprising program code to operate the chambers 28a-d and their components, the transfer chamber 154 and robot 162, process monitoring software to monitor the processes being performed in the chambers, safety systems software, and other control software, as for example. The computer-readable program may be written in any conventional computer-readable programming language.

Although exemplary embodiments of the present invention are shown and described, those of ordinary skill in the art may devise other embodiments which incorporate the present invention, and which are also within the scope of the present invention. For example, the chamber 24 may comprise components other than those specifically described, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. An apparatus comprising:
   (i) a cleaning chamber comprising a process zone to hold a substrate to clean the substrate in an energized cleaning gas, the cleaning chamber having a gas inlet channel;
   (ii) a remote chamber comprising a remote gas energizer for remotely energizing a cleaning gas by coupling energy to a cleaning gas in a gas energizer zone, the remote chamber having a gas outlet channel; and
   (iii) a connecting ceramic liner to connect the gas outlet channel of the remote chamber to the gas inlet channel of the substrate cleaning chamber, the ceramic liner comprising:
      (a) an inlet cylinder having an outer diameter sized to fit in the gas outlet channel of the remote chamber;
      (b) an outlet cylinder connected to the gas inlet channel of the substrate cleaning chamber, the outlet cylinder having a length; and
      (c) a conical flare joining the inlet cylinder to the outlet cylinder, the conical flare having a length.

2. An apparatus according to claim 1 wherein the conical flare comprises a conical surface that is inclined from a vertical axis at an angle of from 10 to about 60 degrees.

3. An apparatus according to claim 1 wherein the ratio of the length of the conical flare to the length of the outlet cylinder is from about 1:2 to about 1:8.

4. An apparatus according to claim 1 wherein the inlet cylinder comprises a first diameter and the outlet cylinder comprises a second diameter that is at least 1.5 times larger that the first diameter.

5. An apparatus according to claim 1 wherein the inlet cylinder is sufficiently long to extend out from the remote chamber by a distance of at least about 50 mm.

6. An apparatus according to claim 4 wherein the inlet cylinder, conical flare and the outlet cylinder are integrally connected.

7. An apparatus according to claim 1 wherein the ceramic liner comprises a ceramic material capable of scavenging an ion species from the energized gas generated in the remote gas energizer.

8. An apparatus according to claim 1 wherein the ceramic liner is composed of quartz, aluminum oxide or aluminum nitride.

9. An apparatus according to claim 1 wherein the ceramic liner comprises a thickness of from about 2 mm to about 6 mm.

10. An apparatus according to claim 1 further comprising a liner locking cylinder that is sized to fit around the outer diameter of the outlet cylinder of the ceramic liner.

11. An apparatus according to claim 1, wherein the cleaning chamber comprises a substrate heating pedestal to hold the substrate, and an exhaust system.

12. An apparatus according to claim 1 wherein the an inlet cylinder, outlet cylinder and conical flare, of the ceramic liner, are all composed of a material capable of scavenging species from an energized gas.

13. An apparatus according to claim 12 wherein the material is provided in a thickness sufficiently high to scavenge species from an energized gas for at least about 30,000 process cycles.

14. An apparatus according to claim 1 wherein the inlet cylinder, outlet cylinder and conical flare, of the ceramic liner, are all composed of quartz.

15. An apparatus comprising:
(i) a cleaning chamber comprising a process zone to hold a substrate to clean the substrate in an energized cleaning gas, the cleaning chamber having a gas inlet channel;
(ii) a remote chamber comprising a remote gas energizer for remotely energizing a cleaning gas by coupling energy to a cleaning gas in a gas energizer zone, the remote chamber having a gas outlet channel; and
(iii) a connecting ceramic liner to connect the gas outlet channel of the remote chamber to the gas inlet channel of the substrate cleaning chamber, the ceramic liner comprising:
 (a) an inlet cylinder having an outer diameter sized to fit in the gas outlet channel of the remote chamber;
 (b) an outlet cylinder connected to the gas inlet channel of the substrate cleaning chamber, the outlet cylinder having a length; and
 (c) a conical flare joining the inlet cylinder to the outlet cylinder, the conical flare having a length such that a ratio of the length of the conical flare to the length of the outlet cylinder is from about 1:2 to about 1:8.

16. An apparatus according to claim 15 wherein the conical flare of the ceramic liner comprises a conical surface that is inclined from a vertical axis at an angle of from 10 to about 60 degrees.

17. An apparatus according to claim 15 wherein the inlet cylinder of the ceramic liner comprises a first diameter and the outlet cylinder comprises a second diameter that is at least 1.5 times larger that the first diameter.

18. An apparatus according to claim 15 wherein the ceramic liner is composed of quartz, aluminum oxide or aluminum nitride.

19. An apparatus according to claim 15 further comprising a liner locking cylinder that is sized to fit around the outer diameter of the outlet cylinder of the ceramic liner.

20. An apparatus according to claim 15, wherein the cleaning chamber comprises a substrate heating pedestal to hold the substrate, and an exhaust system.

21. An apparatus comprising:
(i) a cleaning chamber comprising a process zone to hold a substrate to clean the substrate in an energized cleaning gas, the cleaning chamber having a gas inlet channel;
(ii) a remote chamber comprising a remote gas energizer for remotely energizing a cleaning gas by coupling energy to a cleaning gas in a gas energizer zone, the remote chamber having a gas outlet channel; and
(iii) a connecting ceramic liner to connect the gas outlet channel of the remote chamber to the gas inlet channel of the substrate cleaning chamber, the ceramic liner comprising:
 (a) an inlet cylinder having a first diameter sized to fit in the gas outlet channel of the remote chamber;
 (b) an outlet cylinder connected to the gas inlet channel of the substrate cleaning chamber, the outlet cylinder having (i) a second diameter that is at least 1.5 times larger that the first diameter of the inlet cylinder, and (ii) a length; and
 (c) a conical flare joining the inlet cylinder to the outlet cylinder, the conical flare having a length such that a ratio of the length of the conical flare to the length of the outlet cylinder is from about 1:2 to about 1:8.

22. An apparatus according to claim 21 wherein the conical flare of the ceramic liner comprises a conical surface that is inclined from a vertical axis at an angle of from 10 to about 60 degrees.

23. An apparatus according to claim 21 wherein the ceramic liner is composed of quartz, aluminum oxide or aluminum nitride.

\* \* \* \* \*